(12) United States Patent
Kawahashi

(10) Patent No.: US 6,617,573 B2
(45) Date of Patent: Sep. 9, 2003

(54) CARRIER DEVICE HAVING A CARRIER SURFACE WITH AN OPENING FOR CONNECTING WITH GROOVES

(75) Inventor: Takashi Kawahashi, Sagamihara (JP)

(73) Assignee: Ushiodenki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/983,611

(22) Filed: Oct. 25, 2001

(65) Prior Publication Data

US 2003/0080287 A1 May 1, 2003

(51) Int. Cl.$^7$ ................................................ H01J 5/02
(52) U.S. Cl. ..................... 250/239; 451/388; 269/21
(58) Field of Search ........................ 250/239, 559.33, 250/559.27; 451/388; 269/21, 16, 47

(56) References Cited

U.S. PATENT DOCUMENTS 6,422,922 B1 * 7/2002 Okamura et al. ............. 451/41

FOREIGN PATENT DOCUMENTS

| JP | 5-218183 | 8/1993 |
| JP | 6-333799 | 12/1994 |

* cited by examiner

*Primary Examiner*—Que T. Le
(74) *Attorney, Agent, or Firm*—Nixon Peabody LLP; David S. Safran

(57) ABSTRACT

To devise a carrier device in which no air can accumulate between the flexible board and the carrier surface when the flexible board is held securely by vacuum suction by the carrier surface, the carrier surface of the carrier device on which the flexible board is placed is provided with an opening for supplying a vacuum and with several grooves which extend radially from the opening, the grooves being connected to one another only at the opening.

14 Claims, 5 Drawing Sheets

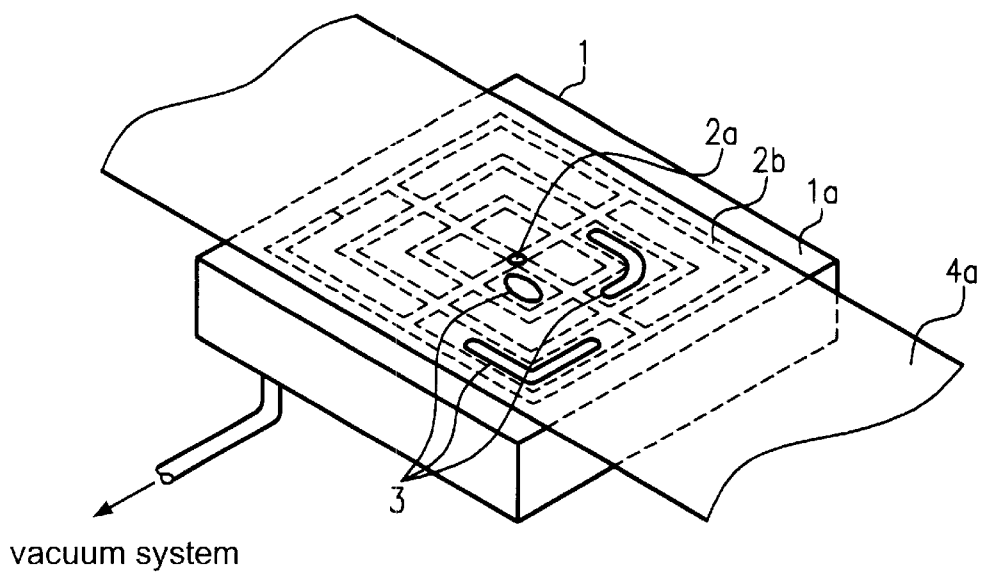
Fig.7
(Prior Art)
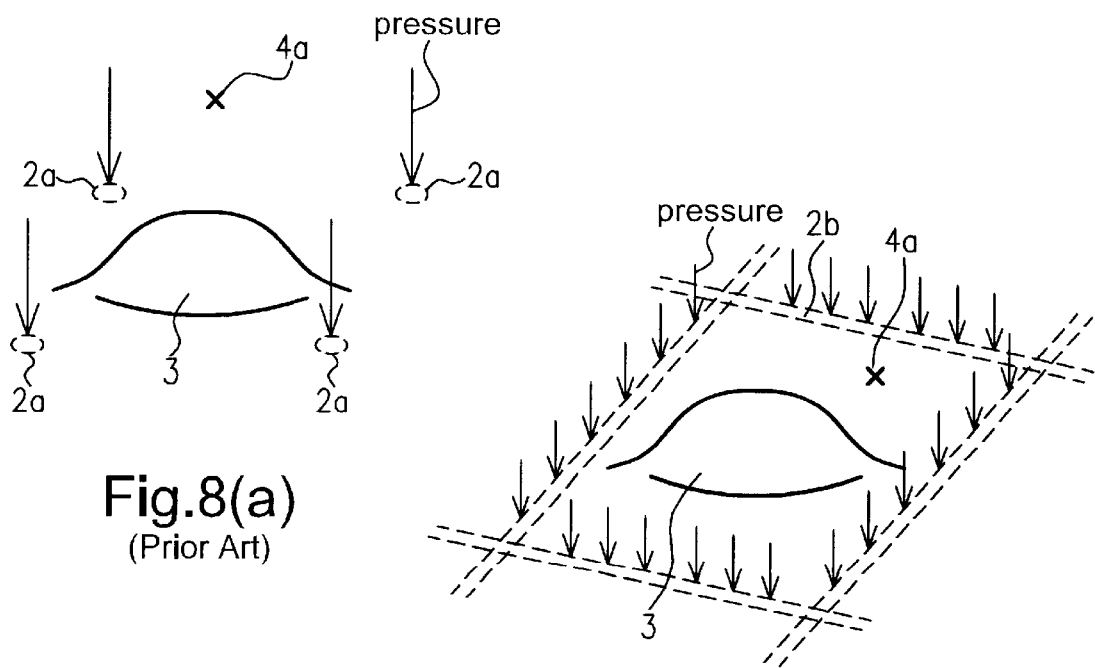
Fig.8(a)
(Prior Art)
Fig.8(b)
(Prior Art)

CARRIER DEVICE HAVING A CARRIER SURFACE WITH AN OPENING FOR CONNECTING WITH GROOVES

BACKGROUND OF THE INVENTION

1. Field of the Invention

The invention relates to a carrier device which suctions and secures a film of organic compound which is used for flexible printed boards or the like, and an easily deformable workpiece of thin metal foil or the like which is used for the magnetic head of a hard disk (hereinafter, together generally called a "flexible board"). The invention relates especially to an arrangement of a vacuum suction groove by which the flexible board is suctioned and secured on the carrier without being deformed.

2. Description of Related Art

An exposure device by which a pattern, such as a circuit or the like, is exposed in a semiconductor wafer, conventionally, has a carrier (hereinafter, called an exposure carrier) which can hold the semiconductor wafer securely. The reason for this is that it is necessary to secure the semiconductor wafer in the exposure carrier to prevent the following during transport of the semiconductor wafer to an exposure position and in the placement of the semiconductor wafer on the exposure carrier:

the semiconductor wafer from diverging from the exposure position of the exposure carrier, and a position deviation arising in the semiconductor wafer during exposure as a result of vibration or the like and thus faulty exposure occurring.

As the means for securing the semiconductor wafer in the exposure carrier, generally a vacuum suction process is used in which the pressure in the space between the workpiece, such as the semiconductor wafer or the like, and the carrier is reduced so that the workpiece is drawn onto the carrier by the pressure difference relative to atmospheric pressure, and thus, the workpiece is secured on the carrier.

In an exposure carrier using the vacuum suction process (hereinafter called a vacuum suction carrier), the carrier surface on which the semiconductor wafer is placed is provided with holes, grooves, and the like which are used to form a negative pressure space between the semiconductor wafer and the vacuum suction carrier, and to which a vacuum system is attached which is used to supply the vacuum.

Japanese patent disclosure document HEI 5-218183 discloses a carrier in which the carrier surface on which the semiconductor wafer is placed is provided with vacuum suction openings. Furthermore, Japanese patent disclosure document HEI 6-333799 discloses a carrier in which in the center of the carrier surface on which the semiconductor wafer is placed, there is a vacuum suction opening around which several vacuum suction grooves are concentrically arranged relative to one another, and in which furthermore, proceeding from the above described vacuum suction opening, connecting grooves are radially arranged in order to connect the above described vacuum suction opening to the above described vacuum suction grooves.

Recently, there has been a demand for the formation of a fine circuit pattern not only in a semiconductor wafer, but also in a film of organic compounds with a thickness of roughly 20 to 150 microns, and in an easily deformable workpiece, such as a thin metal foil or the like, i.e., in a flexible board. As the device for forming the circuit pattern, an exposure device with the above described vacuum suction carrier is being used more and more often. However, when using the above described exposure device for a flexible board or the like, there are also cases in which the following disadvantage arises:

FIG. 6 schematically shows a state in which a flexible board is held securely by a carrier which is provided with several vacuum suction openings. FIG. 7 schematically shows a state in which a flexible board is securely held by a carrier which has several rectangular vacuum suction grooves which are located concentrically around a vacuum suction opening, and connecting grooves which connect the vacuum suction opening and the vacuum suction grooves to one another.

In the case in which the flexible board 4, for example, a strip workpiece 4a, with a great length is held by the vacuum suction carrier 1 shown in FIGS. 6 & 7, between the vacuum suction openings 2a, or between the vacuum suction grooves 2b; air accumulations form, which result in cases in which the strip workpiece 4a is deformed such that it partially projects.

If, in the state in which these air accumulations 3 have formed, for example, in a projection exposure device, a projection lens projects a circuit pattern which has been formed in the mask onto the strip workpiece 4a, the sites of the strip workpiece 4a at which the air accumulations 3 have formed are located at positions which diverge from the imaging position of the mask pattern. The projection image of the mask pattern therefore becomes blurry, by which faulty image resolution, variation of the dimensions of the wiring pattern and the like arise. Therefore, there are cases in which faulty products result.

In the case of an exposure device in which alignment marks which are recorded on the mask and workpiece are determined and processed using an image processing device and in which thus the mask is positioned to the workpiece, workpiece mark images which are taken into the image processing device are deformed or they become blurry when the points provided with the workpiece alignment marks (workpiece marks) project in the manner described above. The image processing device cannot detect the workpiece marks. Therefore, the workpiece mark images can no longer be determined, and the mask can no longer be positioned relative to the workpiece.

The above described air accumulations are presumably formed by the following mechanism.

When the flexible board, for example, the strip workpiece 4a, is placed on a carrier surface 1a, not all the air between the carrier surface 1a and the strip workpiece 4a can be forced out since the strip workpiece 4a is thin and can be easily deformed. The strip workpiece 4a is therefore placed on the carrier surface 1a in the state in which it contains little air. When the vacuum suction openings 2a or vacuum suction grooves 2b are supplied with a vacuum, at the sites of the strip workpiece 4a which are located on the vacuum suction openings 2a or vacuum suction grooves 2b, a pressure difference relative to atmospheric pressure is formed by which the strip workpiece 4a is drawn against the carrier surface 1a. If, in doing so, air remains in the areas which are surrounded by the openings 2a or the grooves 2b, the air is enclosed by the deformation of the strip workpiece 4a and occurs as an air accumulation 3 (FIG. 8(a) & 8(b)).

SUMMARY OF THE INVENTION

The invention was devised to eliminate the above described defect in the prior art. Thus, a primary object of the invention is to devise a carrier device in which no air can accumulate between the flexible board and the carrier surface when the flexible board is held securely by vacuum suction on the carrier surface.

The inventor has stated that numerous air accumulations form between the flexible board and the carrier surface in the areas which are surrounded by the vacuum suction openings or the vacuum suction grooves which are located on the carrier surface. Based on this statement he has considered the following.

Specifically, if a vacuum is supplied to the vacuum suction openings and or the vacuum suction grooves, so that the flexible board is held by the carrier surface, the flexible board presses the air between the carrier surface and the flexible board onto the edge of the flexible board and it is suctioned against the carrier surface and secured. If, in doing so, there are areas on the carrier surface which are surrounded by vacuum suction openings or vacuum suction grooves, the flexible board is suctioned by the vacuum suction openings or vacuum suction grooves before the air between the carrier surface and the flexible board completely disappears. As a result the air remaining between the carrier surface and the flexible board cannot escape and an air accumulation is formed.

Based on the above described consideration, the inventor found that the formation of air accumulations can be prevented by placing vacuum suction openings or vacuum suction grooves on the carrier surface such that no area is formed which is surrounded by the vacuum suction openings or vacuum suction grooves. The inventor devised the invention based on this finding.

The above object is achieved, according to the invention, in a carrier device for securing the flexible board by vacuum suction in that the carrier surface of the carrier device on which the above described flexible board is placed is provided with an opening for supplying a vacuum and with several grooves which extend radially from the opening, and that the grooves are connected to one another only at the above described opening.

The above described arrangement prevents an area from being formed on the carrier surface which is surrounded by the vacuum suction openings or grooves (on all sides). The air remaining between the carrier surface and the flexible board is therefore gradually forced to the outside proceeding from the vacuum supply opening, i.e., in the direction toward the edge of the flexible board when the flexible board is securely held by the carrier surface by vacuum suction.

The invention is described further below using several embodiments shown in the drawings.

BRIEF DESCRIPTION OF THE DRAWINGS

FIG. 7 shows a flexible board which is held securely by a carrier which is provided with several vacuum suction grooves which are located concentrically relative to one another around a vacuum suction opening, and with connecting grooves which connect the vacuum suction opening and the vacuum suction grooves to one another; and FIGS. 8(a) & 8(b) each show a schematic of a state in which an air accumulation forms.

DETAILED DESCRIPTION OF THE INVENTION

Figure 1:
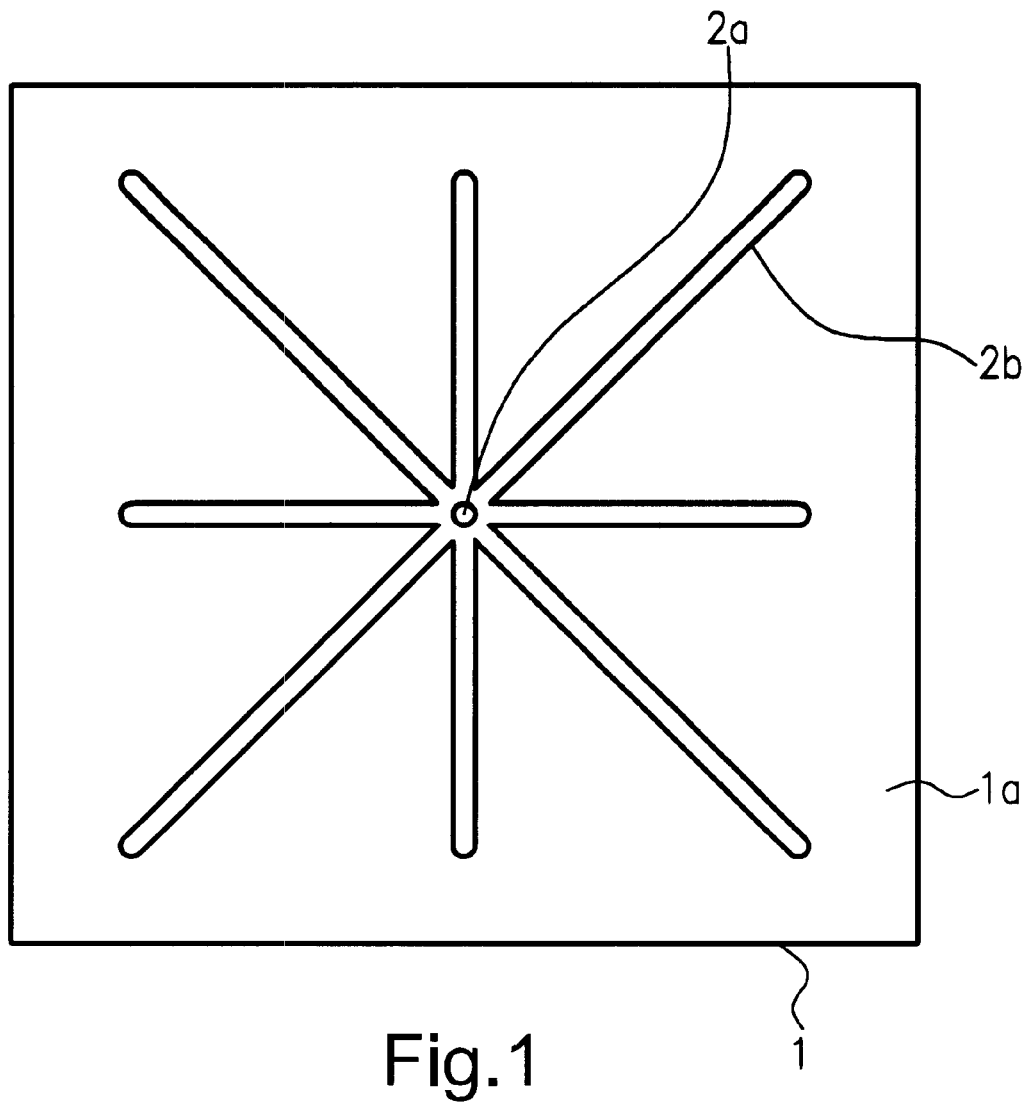
FIG. 1 shows the carrier surface of a carrier device according to one embodiment of the invention.
Figure 6:
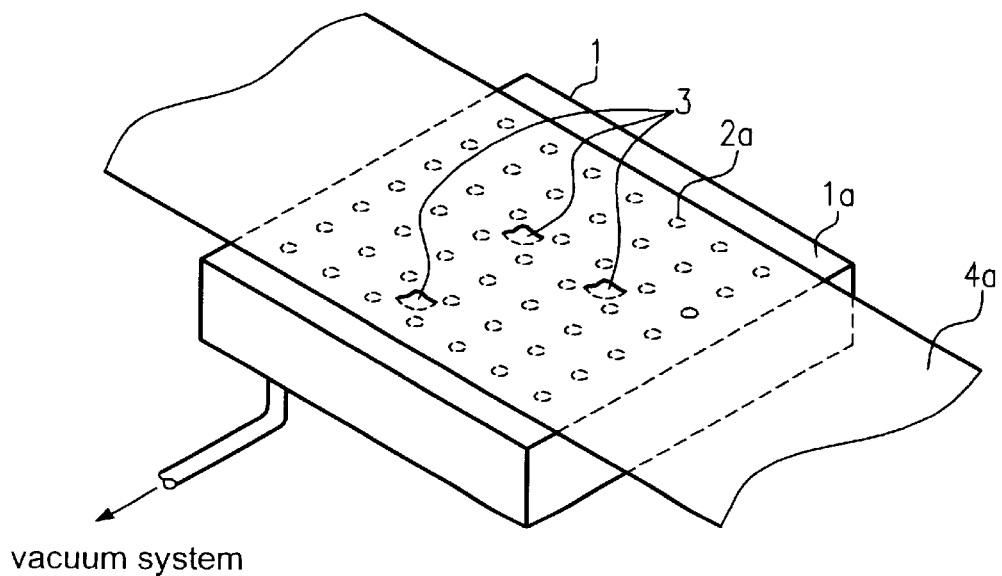
FIG. 6 shows a flexible board which is held securely by a carrier which is provided with a grid of individual vacuum suction openings.

FIG. 1 is a schematic of an arrangement of a carrier surface of a carrier device in one embodiment of the invention. In the figure, the same parts as in FIGS. 6 & 7 are labeled with the same reference numbers as in FIGS. 6 & 7 to facilitate comparison. The carrier 1 of the carrier device in accordance with the invention is formed from an aluminum block with a surface which has undergone non-electrode nickel plating and has essentially the shape of a square which is somewhat larger than the width of the flexible board 4 to be placed on it.

The carrier has a middle area and an edge area which surrounds the middle area. At one point, in the middle area, roughly in the center of the above described carrier, a through opening 2a is formed. On the carrier surface I a on which the above described flexible board 4 is placed, there are eight straight grooves 2b which run radially from the opening 2a and end in the edge area. For example, the diameter of the above described opening is 1 mm, the width W of the groove is 0.4 mm and the depth D of the groove is 0.5 mm. The dimensions of the opening and the groove, however, are not limited to the aforementioned dimensions, but can be suitably established according to the size, softness, amount of camber in the transverse direction and the like of the flexible board 4.

A vacuum system (not shown) for supply of a vacuum via a piping tube and a coupling (not shown) is connected to the opening 2a at the surface opposite the carrier surface 1a on which the flexible board 4 is placed.

The state in which the flexible board is suctioned and secured by the above described carrier is described below using FIGS. 2(a) to 2(d). FIGS. 2(a) to 2(d) show the changes of the shape of the flexible board in an exaggerated manner to facilitate understanding.

Figure 2A:
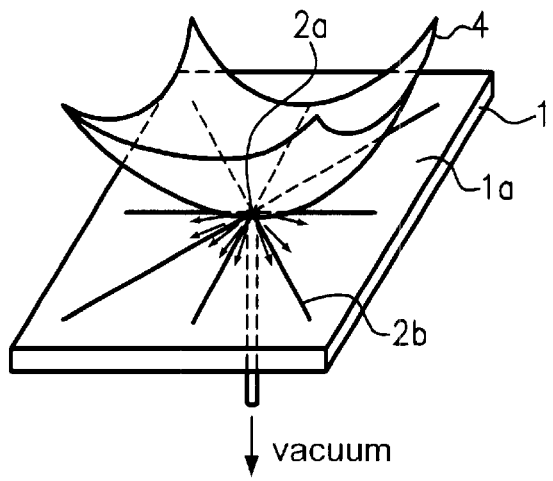
FIGS. 2(a)–(d) each show a stage of the flexible board being suctioned and secured by means of the carrier of the carrier device using the FIG. 1 embodiment of the invention.
Figure 2B:
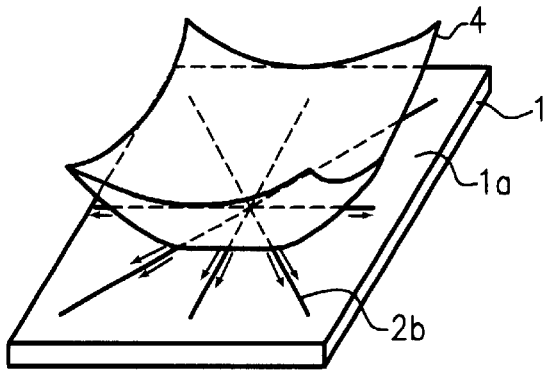

(1) When a flexible board 4 with a thickness of from roughly 20 to 150 microns is transported onto the carrier surface 1a, a vacuum is supplied to the opening 2a by the vacuum system. One point on the flexible board 4 which is located directly on the opening 2a is suctioned first (FIG. 2(a)), (2) Then, the peripheral area of the above described suctioned site of the flexible board 4 is suctioned by the vacuum which has been supplied by the vacuum suction grooves 2b. Moreover, the air remaining between the carrier surface 1a and the flexible board 4 is gradually forced to the outside proceeding from the opening 2a, as is shown in FIG. 2(b) using the arrows.

Figure 2C:
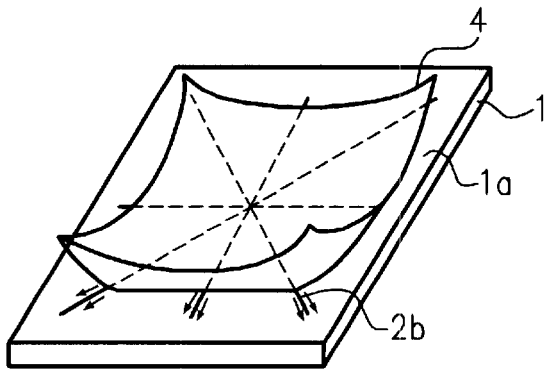

(3) In this way, the flexible board 4 is progressively suctioned and secured by the carrier surface 1a in the direction toward the peripheral area, proceeding from the area of the carrier surface 1a provided with the opening 2a (FIG. 2(c)).

Figure 2D:
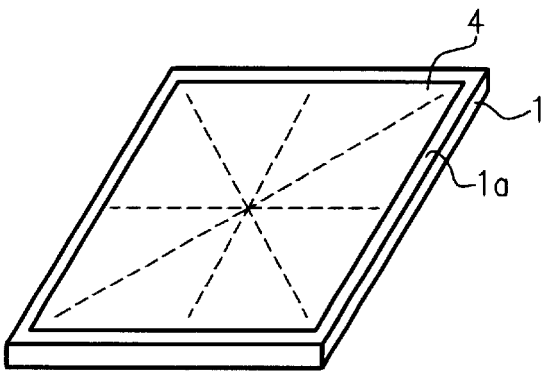

(4) Finally, the entire flexible board 4 is suctioned and secured in a state in which no air remains between the carrier surface 1a and the flexible board 4 (FIG. 2(d)).

The action of the embodiment shown in FIGS. 1 & 2 is described below.

The carrier device in this embodiment is formed from an aluminum block, the surface 1a of the carrier 1 having been subjected to a non-electrode nickel plating, and has essentially the shape of a square which is somewhat larger than the flexible board 4 to be placed on it. At one point, roughly in the center of the above described carrier 1, the opening 2a is formed. There are eight straight grooves 2b which run radially outward from the opening 2a in the carrier surface 1a on which the above described flexible board 4 is placed.

On the carrier surface of the carrier device, there are specifically a vacuum supply opening and several grooves which run radially outward from this opening and which are connected to one another only at this opening. Therefore, formation of an area on the carrier surface which is surrounded on all sides by the vacuum suction openings or vacuum suction grooves is prevented. The air remaining between the carrier surface and the flexible board is therefore gradually forced outward from the vacuum supply opening, i.e., in the direction toward the edge of the flexible board when the flexible board is securely held by the carrier surface by vacuum suction. This prevents any air from remaining between the flexible board and the carrier surface and the flexible board can be suctioned and secured on the carrier surface without air accumulations forming.

In the above described embodiment there are eight grooves on the carrier surface. However, the number of grooves is not limited, but can be suitably established according to the size, softness, the amount of camber in the transverse direction and the like of the flexible board.

Figure 3:
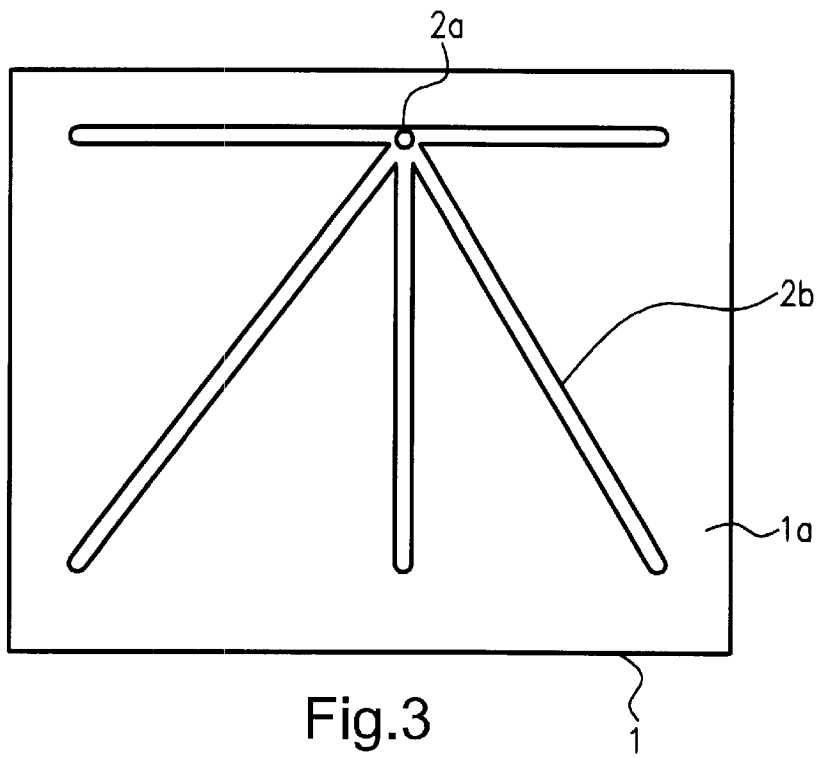
FIG. 3 shows a second embodiment of the invention in which the vacuum suction opening on the carrier surface of the carrier device is located near one edge of the carrier surface.

The carrier of the carrier device according the invention is formed from an aluminum block with a surface which has undergone non-electrode nickel plating and has essentially the shape of a square, but the carrier in accordance with the invention is, however, not limited to this example. Instead, for surface treatment of the carrier, anodizing treatment or deposited ceramics can be used. Furthermore, the carrier material can also be another metal, such as iron, copper, or the like or some other suitable material. With respect to the carrier shape, for a rectangular flexible board a rectangular carrier can be used and for a circular flexible board a circular carrier can be used. In the carrier of the carrier surface in this embodiment, the vacuum supply opening was located roughly in the middle of the carrier surface. However, the invention is not limited to this, but the vacuum suction opening can be placed near one edge of the carrier surface and proceeding from this opening there can be radially running vacuum suction grooves, as is illustrated in FIG. 3.

Figure 4:
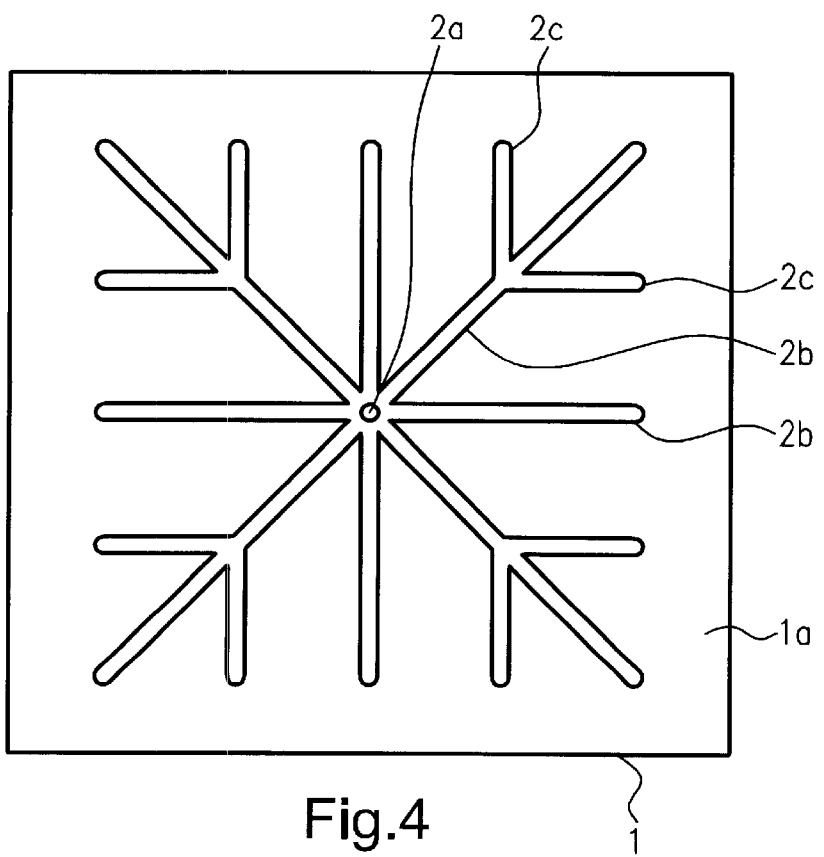
FIG. 4 shows an arrangement of the carrier surface of a carrier device according to a third embodiment of the invention.

FIG. 4 schematically shows another arrangement of the carrier surface of a carrier device of another embodiment of the invention. In the figure, the same parts as in FIGS. 6 & 7 are labeled with the same reference numbers as in FIGS. 6 & 7 to facilitate comparison. The carrier 1 of the carrier device in this embodiment is a carrier 1 which corresponds to the case in which the surface of the flexible board 4 to be suctioned is large. In the case in which the surface of the flexible board 4 is large, the carrier surface 1a is also correspondingly large. Here, if the carrier of the carrier device in the above described embodiment is used unchanged, the many radial grooves 2b located on the carrier surface 1a are caused to approach one another in the vicinity of opening 2a, but at the edge of the carrier surface 1a they are distant from one another. In the areas surrounded by the grooves 2b on the edge of the carrier surface 1a, the suction force is weaker, resulting in cases in which faulty suctioning occurs in these areas.

Therefore, in the carrier surface 1a of the carrier device in this embodiment, at a point roughly in the center of the above described carrier 1, an opening 2a is formed as well as eight straight grooves 2b. Furthermore, the straight radial grooves 2b are each branched into several grooves 2c. The several grooves 2b, here, are connected to one another only via the opening 2a. The branched grooves 2c are connected to one of the straight grooves 2b, but not to the other straight grooves 2b. The branched grooves 2c are connected to one another on the straight groove 2b, but in the other areas they are not connected to one another. Therefore, in the carrier surface 1a, no area is formed which is surrounded on all sides by the grooves 2b, 2c.

The air remaining between the carrier surface and the flexible board is therefore gradually forced toward the outside proceeding from the vacuum supply opening, ie., in the direction toward the edge of the flexible board, when the flexible board is securely held by the carrier surface by vacuum suction. Therefore, this prevents any air from remaining between the flexible board and the carrier surface, and the flexible board can be suctioned and secured by the carrier surface without air accumulations forming. Furthermore, on the end of the carrier surface la, the distance between the grooves becomes smaller, ensuring a sufficient suction force. Therefore a flexible board 4 with a large surface can be securely suctioned and secured.

Figure 5A:
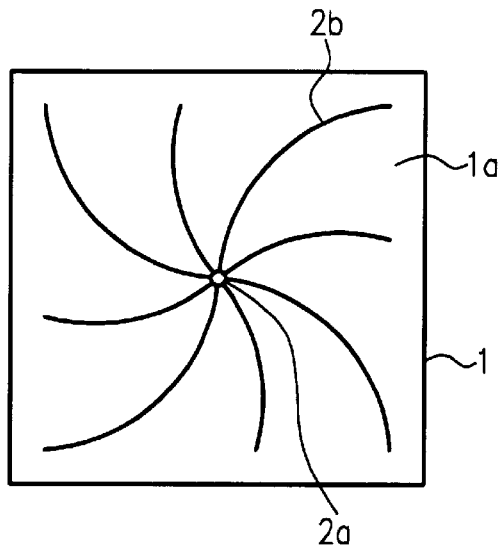
FIGS. 5(a) & 5(b) each show an embodiment of the invention in which the grooves located on the carrier surface of the carrier device are made as curves.
Figure 5B:
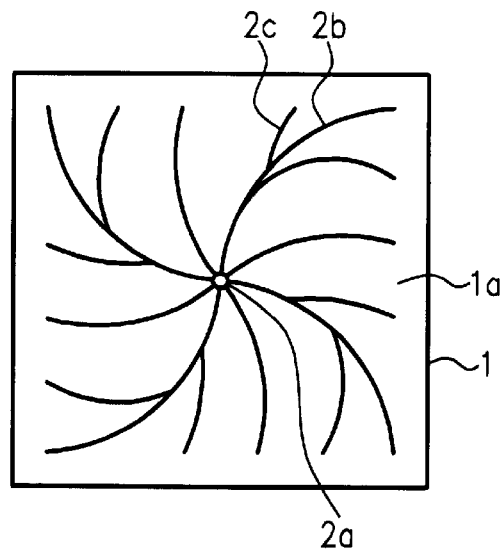

In the above described two embodiments, there are straight vacuum suction grooves on the carrier surface. However, the invention is not limited thereto, but there can also be curved grooves as is shown in FIGS. 5(a) & 5(b).

Furthermore, in the above described embodiments, a case is described by way of example in which the flexible board is a strip workpiece with a great length. However, in a laminated workpiece composed of individual sheets in which the sheets have been combined to a given size, the same action and the same effect are obtained.

ACTION OF THE INVENTION

As was described above, in the carrier device in accordance with the invention, areas which are surrounded by the vacuum suction openings or grooves are prevented from forming on the carrier surface. This prevents any air from remaining between the flexible board and the carrier surface and the flexible board can be suctioned and secured on the carrier surface without air accumulations forming. Therefore, for example, in an application for an exposure device, the workpiece can be securely held at th e imaging position of the mask pattern.

What is claimed is:

1. Carrier device for securely holding a flexible board by vacuum suction, comprising a carrier surface for holding the flexible board which has a middle area and an edge area which surrounds the middle area, wherein the carrier surface is provided with an opening for supplying a vacuum and with several grooves which run radially outward from said opening, said grooves being connected to one another only at said opening.

2. Carrier device as claimed in claim 1, wherein the opening is located essentially in the center of the carrier surface.

3. Carrier device as claimed in claim 2, wherein the grooves extend from the opening into the edge area of the carrier surface.

4. Carrier device as claimed in claim 1, wherein the grooves extend from the opening into the edge area of the carrier surface.

5. Carrier device as claimed in claim 1, wherein the opening is located in the edge area of the carrier surface.

6. Carrier device as claimed in claim 5, wherein at least some of the grooves extend from the opening through the middle area into another portion of the edge area of the carrier surface.

7. Carrier device as claimed in claim 1, wherein at least some of the grooves have branches extending therefrom in an outward direction.

8. Carrier device as claimed in claim 2, wherein at least some of the grooves have branches extending therefrom in an outward direction.

9. Carrier device as claimed in claim 3, wherein at least some of the grooves have branches extending therefrom in an outward direction.

10. Carrier device as claimed in claim 4, wherein at least some of the grooves have branches extending therefrom in an outward direction.

11. Carrier device as claimed in claim 5, wherein at least some of the grooves have branches extending therefrom in an outward direction.

12. Carrier device as claimed in claim 6, wherein at least some of the grooves have branches extending therefrom in an outward direction.

13. Carrier device as claimed in claim 1, wherein the grooves run in a straight line from the opening.

14. Carrier device as claimed in claim 1, wherein the grooves run in a curve from the opening.

* * * * *